US009536808B1

(12) United States Patent
Mu et al.

(10) Patent No.: US 9,536,808 B1
(45) Date of Patent: Jan. 3, 2017

(54) PHOTO PATTERN METHOD TO INCREASE VIA ETCHING RATE

(71) Applicant: Macronix International Co., Ltd., Hsin-chu (TW)

(72) Inventors: Zheng-Chang Mu, Miaoli County (TW); Cheng-Wei Lin, Hsinchu (TW); Kuang-Wen Liu, Hsinchu County (TW)

(73) Assignee: MACRONIX INTERNATIONAL CO., LTD., Hsin-Chu (TW)

( * ) Notice: Subject to any disclaimer, the term of this patent is extended or adjusted under 35 U.S.C. 154(b) by 0 days.

(21) Appl. No.: 14/741,087

(22) Filed: Jun. 16, 2015

(51) Int. Cl.
*H01L 29/40* (2006.01)
*H01L 23/48* (2006.01)
*H01L 23/528* (2006.01)
*H01L 21/768* (2006.01)

(52) U.S. Cl.
CPC ....... *H01L 23/481* (2013.01); *H01L 21/76816* (2013.01); *H01L 21/76877* (2013.01); *H01L 23/528* (2013.01)

(58) Field of Classification Search
CPC ............. H01L 23/481; H01L 21/76816; H01L 21/76877

USPC ......................................... 257/774
See application file for complete search history.

(56) References Cited

U.S. PATENT DOCUMENTS

| | | | |
|---|---|---|---|
| 6,150,678 A | 11/2000 | Tung et al. | |
| 6,280,640 B1 * | 8/2001 | Hurwitz | H01L 21/4846 216/15 |
| 6,395,633 B1 * | 5/2002 | Cheng | H05K 3/4647 438/637 |
| 6,787,896 B1 * | 9/2004 | Petty-Weeks | H01L 23/3677 257/700 |
| 8,344,471 B2 | 1/2013 | Tseng et al. | |
| 2013/0119549 A1 * | 5/2013 | Cheng | B29C 39/10 257/772 |
| 2013/0134543 A1 | 5/2013 | Tseng et al. | |
| 2013/0270685 A1 * | 10/2013 | Yim | H01L 23/10 257/686 |

* cited by examiner

*Primary Examiner* — Long K Tran
(74) *Attorney, Agent, or Firm* — Alston & Bird LLP (57) ABSTRACT

Semiconductor devices are provided having large vias, such as under bonding pads, to increase the via open area ratio, increase the via etching rate, and avoid inter-metal dielectric cracking and damage to the integrated circuit. The via is defined as a large open area in the inter-metal dielectric layer between an isolated conductive bottom substrate layer and a conductive top layer. Methods of manufacturing semiconductor devices with a large via are also provided.

9 Claims, 9 Drawing Sheets

PHOTO PATTERN METHOD TO INCREASE VIA ETCHING RATE

TECHNOLOGICAL FIELD

The present invention generally relates to a photo pattern method to increase via etching rate and semiconductor devices produced by such methods of manufacture. In particular, the present invention relates to methods of manufacture for fabricating semiconductor devices with large vias and increasing via etching rates and semiconductor devices having large vias produced by such methods of manufacture.

BACKGROUND

Advancements in the miniaturization of semiconductor devices continue to emphasize the importance of structural integrities of semiconductor devices. Similarly, advancements in the manufacture of semiconductor devices continue to emphasize the importance of efficiencies of the rate and cost of fabrication, particularly with increasing complexities of manufacturing smaller and smaller semiconductor devices. Manufacturers desire high yield, minimized costs, and reliable semiconductor devices for testing and both installation for and function of use.

Figure 1:
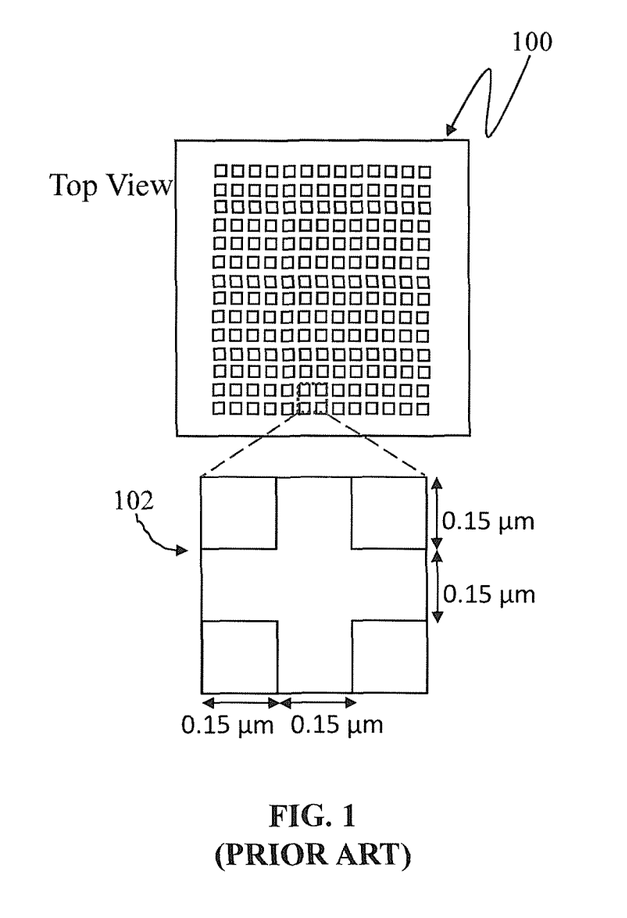
FIG. 1 is an example conventional via structure under a pad, shown with a portion thereof enlarged.

Increased complexities of etching patterns, such as for matrix patterns for vias under pads, and etching loading effects causing differences of etching rates for different shapes (e.g., skinny rectangles compared to squares) and sizes (large and small) for etching must be taken into account. By way of example, the layout of a conventional via under a pad, such as for testing or mounting the semiconductor device, is a matrix pattern with equal spacing and identical sizing, thus reducing loading effect, but decreasing the etching rate. FIG. 1 is an example of such a conventional via under a pad with an equally sized and equally spaced density matrix pattern.

A common problem with conventional matrix pattern vias under metal pads is inter-metal dielectric (IMD) fatigue and cracking, which can result from wafer sorting testing, wire bonding testing, or installation wire bonding, thereby causing damage to the integrated circuit (IC). For example, a probe or bonding ball may poke through the metal pad and/or crush or crack the IMD. A matrix pattern via may not be strong enough to withstand such forces. Thus, the semiconductor device may be damaged at and/or around the pad by such physical contact of wire bonding or probing.

Accordingly, there remains a need in the art for improved methods to increase via etching rate and avoiding inter-metal dielectric cracking and damage to the integrated circuit.

BRIEF SUMMARY OF EXEMPLARY EMBODIMENTS OF THE INVENTION

Embodiments of semiconductor devices of the present invention are provided with large vias structure to allow for increasing the via etching rate and avoid inter-metal dielectric cracking and damage to the integrated circuit. Embodiments of semiconductor devices and methods of manufacture of the present invention are provided that reduce the etching process time and not only reduce the etching process time, but also reduce the cost of the etching process. Embodiments of semiconductor devices and methods of manufacture of the present invention decrease etching process time by increasing the via mask layout.

In one embodiment of the present invention, a semiconductor device includes an inter-metal dielectric layer disposed on a conductive bottom substrate layer, wherein the inter-metal dielectric layer defines a via with the conductive bottom substrate layer and surrounded by the inter-metal dielectric layer, wherein the via comprises a conductive material in contact with a portion of the conductive bottom substrate layer. The semiconductor device also includes a conductive top layer disposed on the inter-metal dielectric layer and the conductive via material. The portion of the conductive bottom substrate layer in contact with the conductive via material may be isolated from adjacent portions of the conductive bottom substrate layer.

In certain embodiments of semiconductor devices of the present invention, such as when the large via size is larger than 400 $\mu m^2$, the portion of the conductive bottom substrate layer in contact with the conductive via material may be isolated from adjacent portions of the conductive bottom substrate layer by at least 0.5 $\mu m$, or by an isolation gap in the range of 0.5 $\mu m$ to 2.0 $\mu m$. Similarly, in certain embodiments of semiconductors of the present invention, the inter-metal dielectric boundary around the entire via above the portion of the conductive bottom substrate layer in contact with the conductive via material may be at least 0.1 $\mu m$, or may be in the range of 0.1 $\mu m$ to 1.0 $\mu m$ around the via.

Another aspect of the present invention provides methods of manufacture, or fabricating, of a semiconductor device having a via, the method including forming an inter-metal dielectric layer on a first portion of the conductive bottom substrate layer isolated from surrounding portions of the conductive bottom substrate layer. The method may also include photo patterning a via mask onto the inter-metal dielectric layer. The method may also include etching the inter-metal dielectric layer to define an open via area to the first portion of the conductive bottom substrate layer, wherein a portion of the inter-metal dielectric layer remains around the open via area with the first portion of the conductive bottom there below. The method may also include depositing a conductive via material in the open via area adjacent the first portion of the conductive bottom substrate layer. The method may further include removing conductive via material remaining above the inter-metal dielectric layer. And the method may also include forming a conductive top layer on the inter-metal dielectric layer and the conductive via material.

Certain embodiments of methods of manufacture of a semiconductor device of the present invention may involve photo patterning a via mask with a via area mask open ratio of at least 90%, at least 98%, or 100%. Certain embodiments of manufacture of a semiconductor device of the present invention may involve etching an open area of at least or greater than 10 $\mu m \times 10$ $\mu m$ or 100 $\mu m^2$ or even at least or greater than 400 $\mu m^2$.

An additional aspect of the present invention provides semiconductor devices manufactured according to a method of manufacture of an embodiment of the present invention.

These embodiments of the present invention and other aspects and embodiments of the present invention are described further herein and will become apparent upon review of the following description taken in conjunction with the accompanying drawings.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 22 is a cross-sectional view of a bottom metal slab and inter-metal dielectric deposition;

FIGS. 23A, 23B, 23C, and 23D are cross-sectional views of a conventional via fabrication process;

FIGS. 24A, 24B, 24C, and 24D are cross-sectional views of a via fabrication process according to an embodiment of the present invention.

DETAILED DESCRIPTION

Some embodiments of the present invention will now be described more fully hereinafter with reference to the accompanying drawings, in which some, but not all embodiments of the present invention are shown. Indeed, various embodiments of the present invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a via" includes a plurality of such vias and reference to "a semiconductor device" includes a plurality of such semiconductor devices, unless the context clearly indicates otherwise.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

The inventors have conceived of certain semiconductor devices, in particular, semiconductor devices with large vias structure, according to embodiments of the present invention having improved via etching rates. The inventors have conceived of a design of semiconductor devices and via structures having improved resilience to avoid damage to the inter-metal dielectric and the integrated circuit (IC) in comparison to conventional semiconductor devices with equally sized and equally spaced density matrix pattern vias. Embodiments of the present invention may provide or be used to manufacture various types of semiconductor memory devices, including, but not limited to, Mask ROM, Flash memory, EPROM, DRAM, FeRAM, and MRAM. Similarly, embodiments of the present invention may provide or be used to manufacture various types of other semiconductor devices, including, but not limited to microprocessors, chipsets, controllers, and CMOS sensors.

The loading effect, or micro-loading effect, of semiconductor process manufacturing technologies results in an increased etching rate with an increased photo pattern open ratio. The via area under the pad is an adjustable region that can be modified to control the etching rate on a via layer etching. Etching rate differences can be accommodated by using an etching recipe that can cover a difference of small size (e.g., 0.2 nm×0.2 nm) to large size (e.g., 65 μm×65 μm). And the etching rate increases with more open ratio in the photo pattern. Thus, embodiments of the present invention are provided that reduce the etching process time and, not only reduce the etching process time, but also reduce the cost of the etching process.

Figure 2:
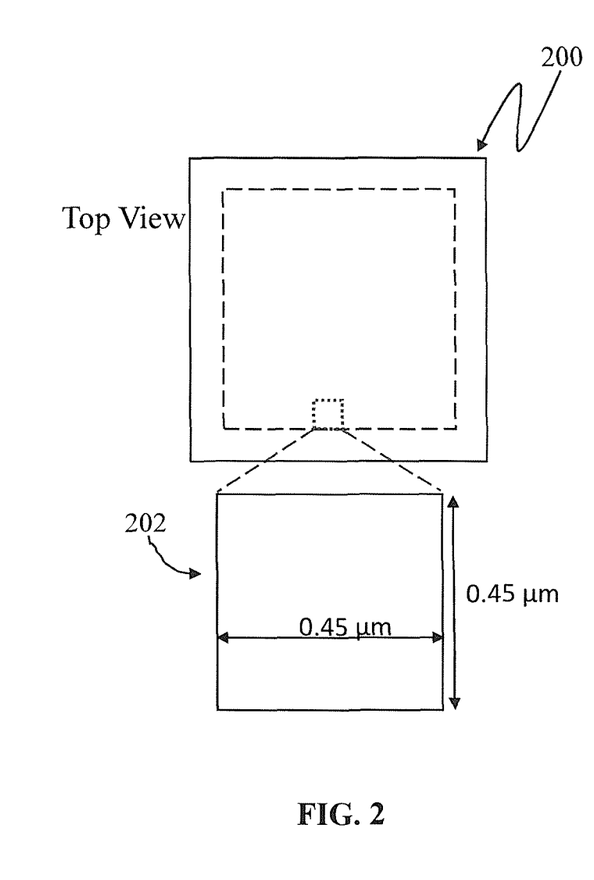
FIG. 2 is a via structure according to an embodiment of the present invention, shown with a portion thereof enlarged.

Embodiments of semiconductor via structures of the present invention decrease etching process time by increasing the via mask layout. For example, the conventional via structure 100 of FIG. 1, in the enlarged portion 102 of the 3×3 matrix of nine 0.15 μm×0.15 μm open via areas to inter-metal dielectric, has an open area ratio of 4:9, or 44%, and, over the entire area of the via, has an open ratio of only 182:496, or 37%. By comparison, the via structure 200 of FIG. 2, in the enlarged 0.15 μm×0.15 μm portion 202 and over the entire area of the via, has an open area ratio of 1, or 100%. Such a via structure of this embodiment of the present invention can increase the etching rate by increasing the via area open ratio, for example, by 56% to 63% or more in comparison to the example conventional via mask layout for the via of FIG. 1. In other embodiments of the present invention, open area ratio can be increased by 91%, i.e., from only 6.9% open to 98% open, thus increasing the etching rate and reducing the time and cost of the etching process.

Figures 3A, 3B:
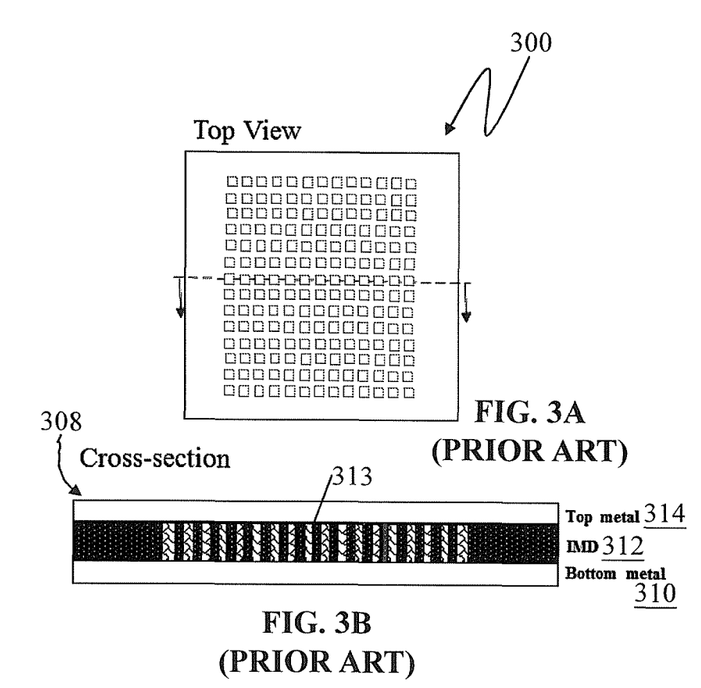
FIG. 3A is a top view of an example conventional via structure with matrix via or multi-via.
FIG. 3B is a cross-sectional view of an example conventional via structure taken along the section line of FIG. 3A.

FIGS. 3A and 3B illustrate, respectively, top 300 and cross-sectional 308 views of an example conventional via structure with matrix via or multi-via. The structure includes a conductive bottom substrate layer 310, such as a metal. An inter-metal dielectric layer 312 is disposed on the conductive bottom substrate layer 310. The via is defined by a plurality of equally spaced identically sized regions of a matrix pattern of conductive via material 313. A conductive top layer 314, such as a metal, is disposed on the inter-metal dielectric layer 312 and the matrix pattern of conductive via material 313.

Figure 4A:
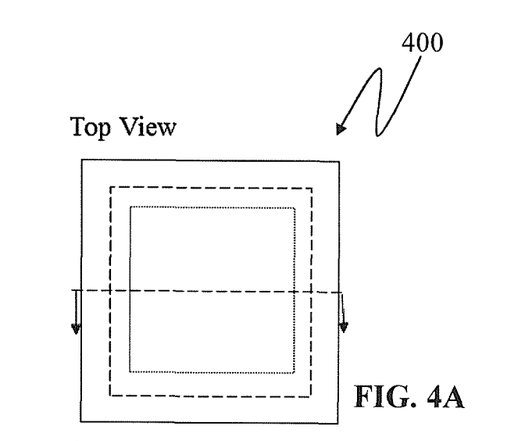
FIG. 4A is a top view of a via structure according to an embodiment of the present invention.
Figure 4B:
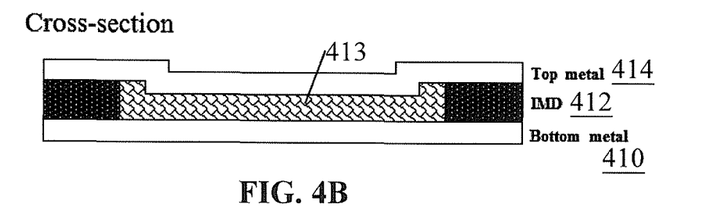
FIG. 4B is a cross-sectional view of a via structure taken along the section line of FIG. 4A.
Figure 5:
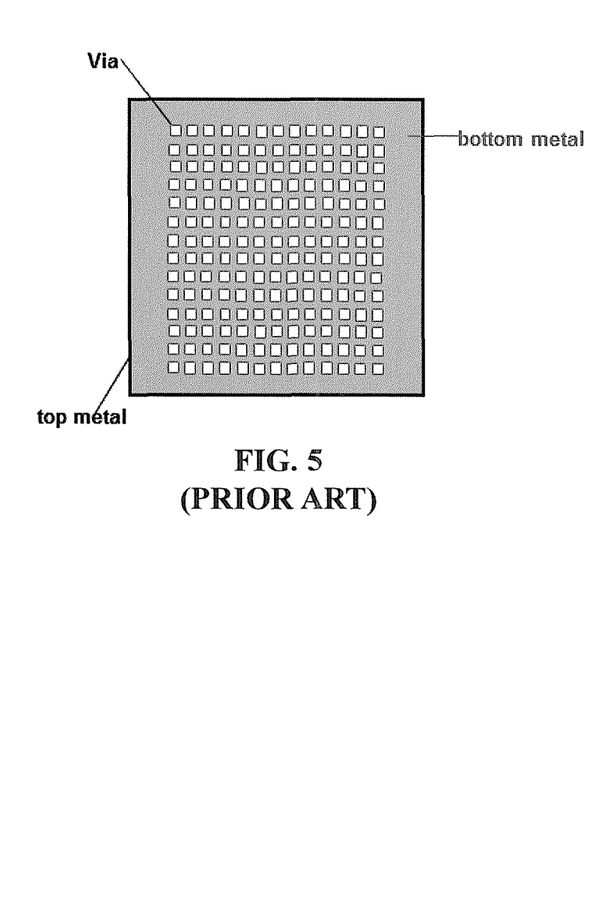
FIGS. 5, 7, 8, 11, and 12 are bottom metal, via, and top metal mask layouts for an example conventional via structure under a pad.
Figure 6:
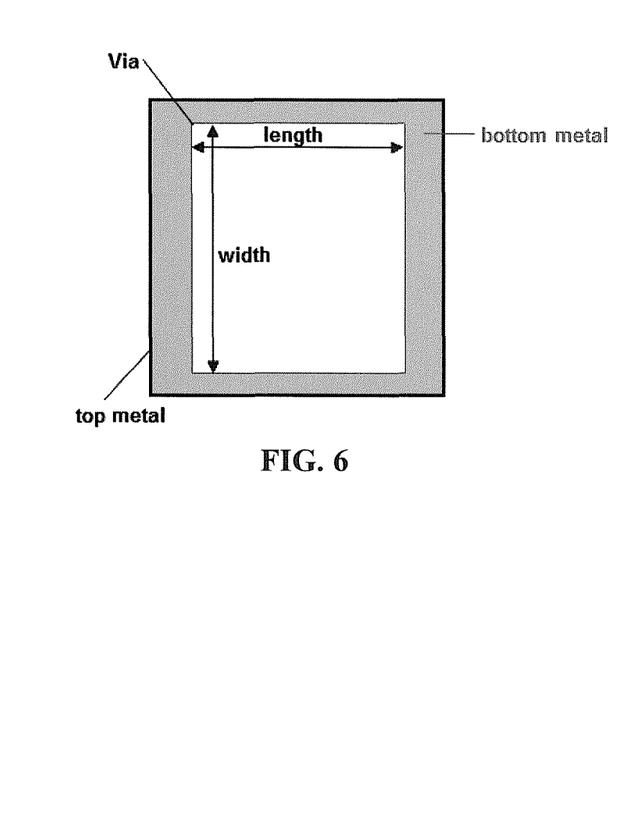
FIGS. 6, 9, 10, 13, and 14 are bottom metal, via, and top metal mask layouts for a via structure according to an embodiment of the present invention.
Figure 7:
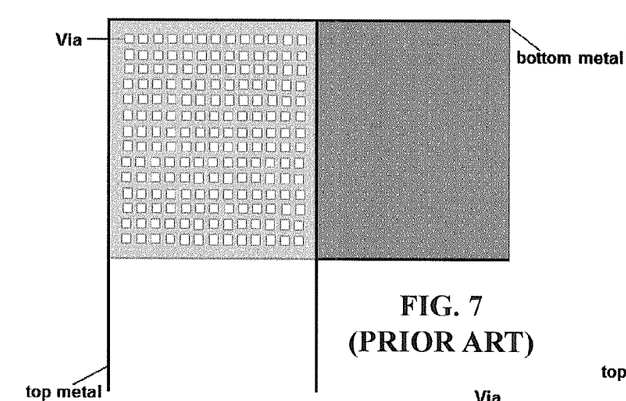
Figure 8:
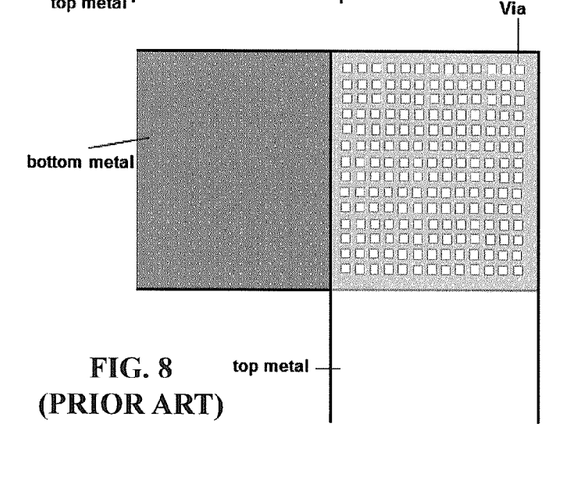
Figure 9:
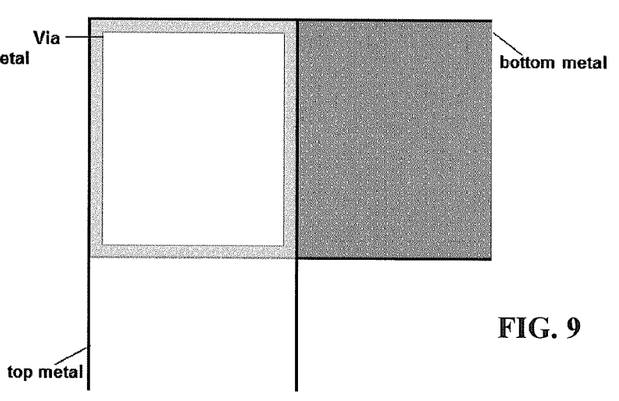
Figure 10:
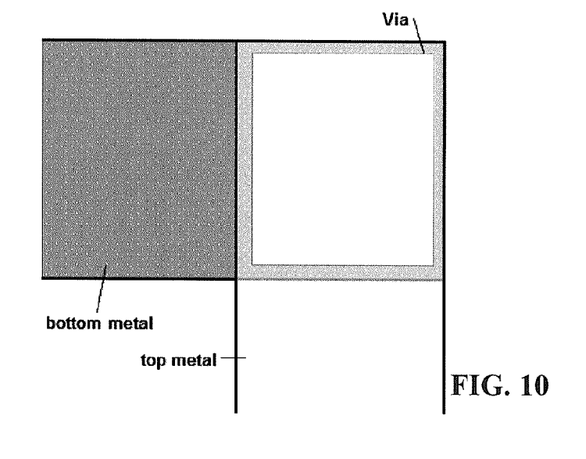
Figure 11:
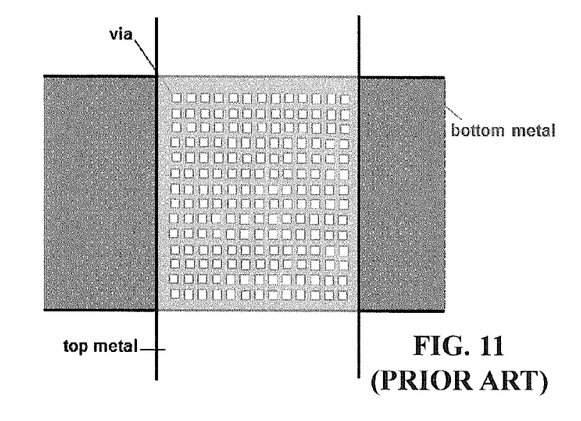
Figure 12:
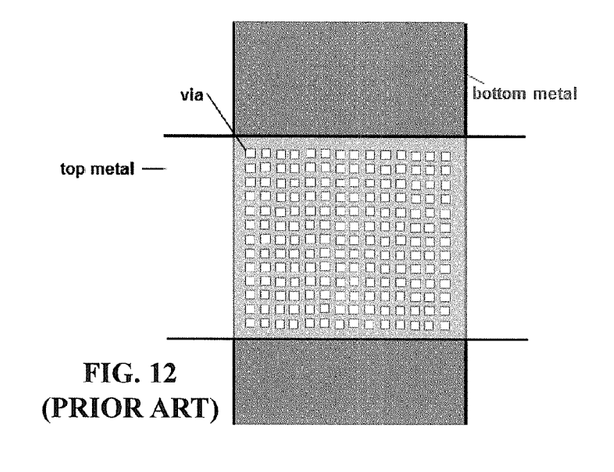
Figure 13:
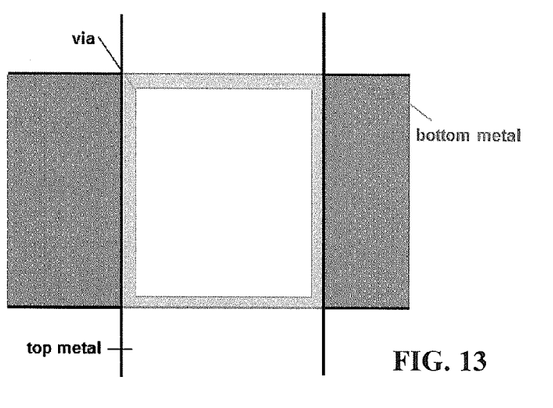
Figure 14:
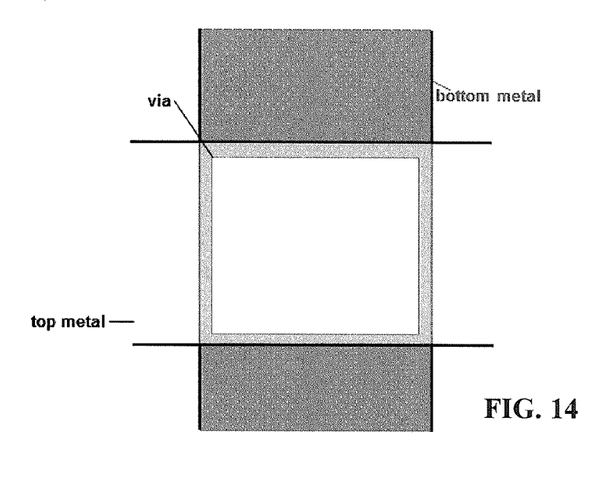

By comparison, FIGS. 4A and 4B illustrate, respectively, top 400 and cross-sectional 408 views of a via structure according to an embodiment of the present invention. The structure includes a conductive bottom substrate layer 410, such as a metal, such as Al and/or Cu. An inter-metal dielectric layer 412 is disposed on the conductive bottom substrate layer 410 surrounding a via defined by an absence of a portion of the inter-metal dielectric layer. A conductive via material 413, such as Tungsten (W), is disposed in the via. A conductive top layer 414, such as a metal, such as Al and/or Cu, is disposed on the inter-metal dielectric layer 412 and the conductive via material 413.

FIGS. 5, 7, 8, 11, and 12 are bottom metal, via, and top metal mask layouts for an example conventional via structure with matrix via or multi-via. The via of FIGS. 5, 7, 8, 11, and 12 is defined by a plurality of equally spaced identically sized regions of a matrix pattern of conductive via material. Each of the open areas of the via of FIGS. 5, 7, 8, 11, and 12 are smaller than 10 μm×10 μm in individual size, or 100 μm².

FIGS. 6, 9, 10, 13, and 14 are bottom metal, via, and top metal mask layouts for a via structure according to an embodiment of the present invention, in comparison to those of FIGS. 5, 7, 8, 11, and 12. The via of FIGS. 6, 9, 10, 13, and 14 is defined by an area of conductive via material of at least 10 μm×10 μm, or 100 μm², or larger. In certain other embodiments of semiconductor devices of the present invention, the via may be larger than 10 μm in length, larger than 10 μm in width, or length and width larger than 10 μm in either or both directions.

According to other embodiments of the present invention, a via may include at least an area of conductive via material of at least 10 μm×10 μm and also one or more smaller areas of conductive via material of less than 10 μm×10 μm. Such a via structure may be described as a hybrid via of small and large areas of conductive via material. For example, a via mask may be designed with both small and large open areas. Further, by way of example, a large area of conductive material may be surrounded by a pattern of smaller areas of conductive via material.

Figure 15:
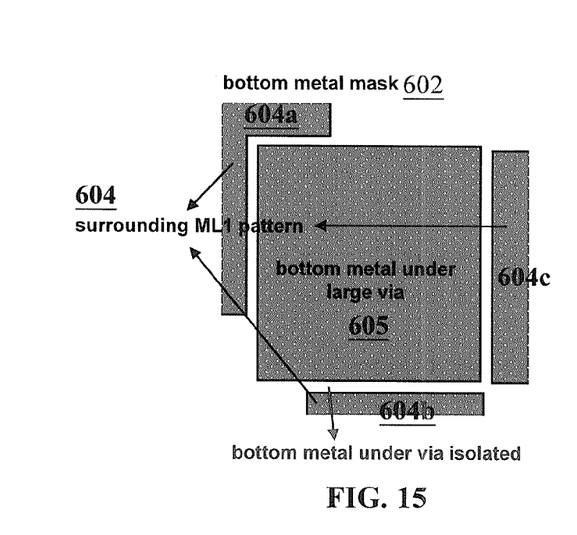
FIG. 15 is a bottom metal mask layout for a large via area which is larger than 400 μm² according to an embodiment of the present invention.
Figure 16:
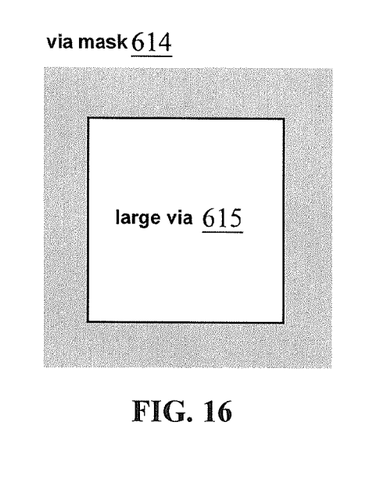
FIG. 16 is a via mask layout for a large via area which is larger than 400 μm² according to an embodiment of the present invention.
Figure 17:
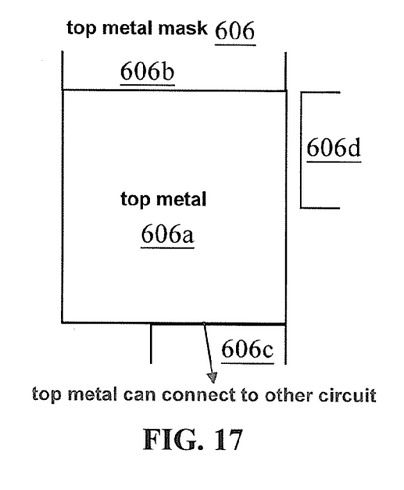
FIG. 17 is a top metal mask layout for a large via area which is larger than 400 μm² according to an embodiment of the present invention.

FIG. 15 illustrates a portion of a bottom metal mask layout 602 for via size larger than 400 μm² according to an embodiment of the present invention. At the center is a bottom metal portion 605 under a large via which size is larger than 400 μm². Adjacent to this bottom middle portion 605 is a surrounding bottom metal pattern 604 including bottom metal portions 604a, 604b, and 604c. Bottom metal portions 604a, 604b, and 604c are not actual layout, but are illustrated to just mean that the bottom metal under the large via is isolated. The center bottom metal portion 605 is isolated by a spacing from the surrounding bottom metal portions 604a, 604b, and 604c to avoid connection to other circuits at the bottom metal layer 605 for avoiding plasma charging effect, such as for a large via area as large as 20 μm×20 μm, or 400 μm²' or larger. Instead, the conductive path of the pad is desired to be at the top metal layer or other layer to connect with the pad. FIG. 16 illustrates a via mask layout 614 according to an embodiment of the present invention. At the center is a large via 615 surrounded by a mask boundary. FIG. 17 illustrates a top metal mask layout 606 according to an embodiment of the present invention. The center top metal portion 606a is adjacent to and connected with top metal portions 606b and 606c, such that the center top metal portion 606a of the pad above the via is connected to other circuits by one or more of top metal portions 606b and 606c at the top metal layer. Top metal portions 606b, 604c, and 604d are not actual layout, but are illustrated to just mean that the top metal above the large via needs to connect to other smaller than 400 μm² vias and then connect to bottom metal. Together, the bottom metal mask 602, via mask 614, and top metal mask 606 may be used for embodiments of the present invention when the via size is larger than 400 μm².

Figure 18:
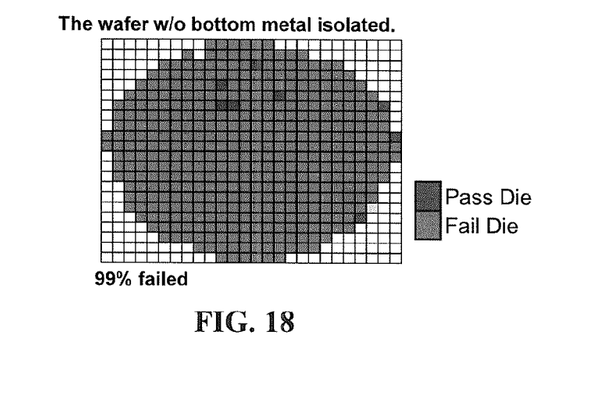
FIG. 18 illustrates die pass or fail of a wafer without bottom metal isolation for a large via area which is larger than 400 μm².
Figure 19:
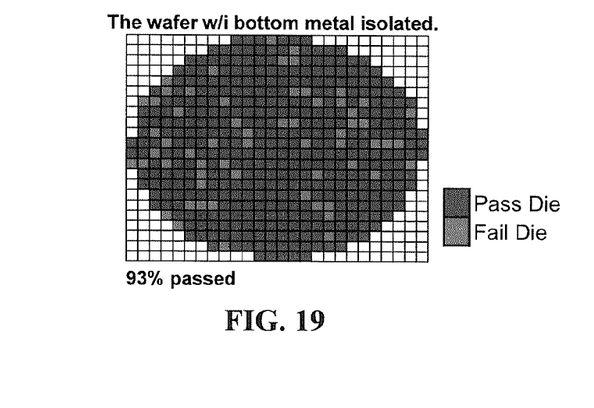
FIG. 19 illustrates die pass or fail of a wafer with bottom metal isolation according to an embodiment of the present invention for a large via area which is larger than 400 μm².

FIG. 18 illustrates die pass or fail of a water without bottom metal isolation when via size is larger than 400 μm². Without the bottom metal isolated, there is a 99% failure rate. By comparison, FIG. 19 illustrates die pass or fail of a wafer with bottom metal isolation according to an embodiment of the present invention. With the bottom metal isolated, as provided by bottom metal mask 602 of FIG. 15, there is a 93% pass rate. This illustrates the plasma charging effect difference between the bottom metal under the large via (larger than 400 μm²) and pad without isolation and with isolation to surrounding bottom metal portions of the bottom metal layer.

Figure 20:
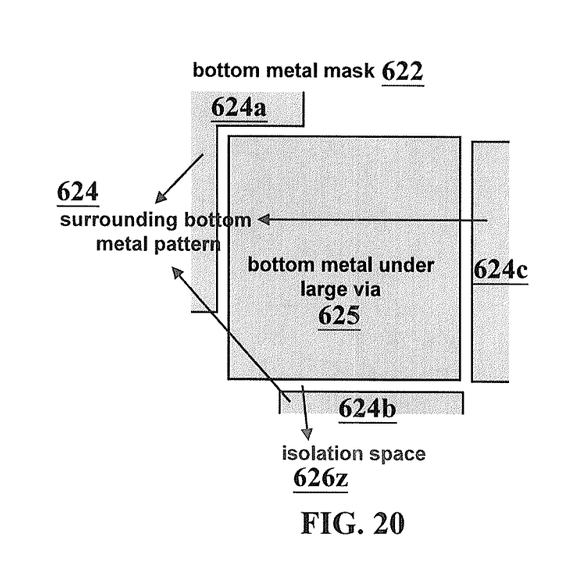
FIG. 20 illustrates a bottom metal mask for a bottom metal under a large via according to an embodiment of the present invention for a large via area which is larger than 400 μm².
Figure 21:
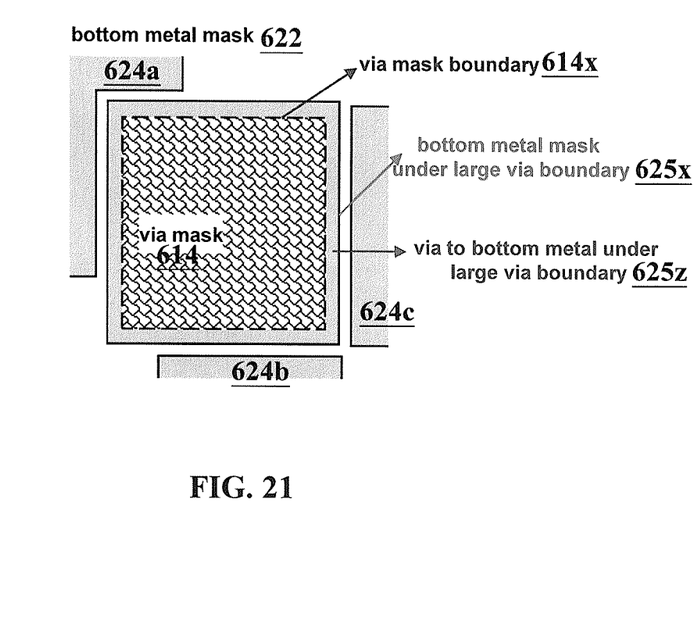
FIG. 21 illustrates a bottom metal mask for a bottom metal in relation to a via mask boundary according to an embodiment of the present invention for a large via area which is larger than 400 μm².

FIG. 20 illustrates a portion of a bottom metal mask layout 622 for a bottom metal portion 625 under a large via according to an embodiment of the present invention. Adjacent to this bottom metal portion 625 is a surrounding bottom metal pattern 624 including bottom metal portions 624a, 624b, and 624c. Bottom metal portions 624a, 624b, and 624c are not actual layout, but are illustrated to just mean that the bottom metal portion 625 is isolated. The bottom metal portion 625 is isolated by a spacing, i.e., an isolation space 626z, also referred to as a boundary distance, from the surrounding bottom metal portions 624a, 624b, and 624c to avoid connection to other circuits at the bottom metal layer 625 for avoiding plasma charging effect, such as for a large via area as large as 20 μm×20 μm, or 400 μm²' or larger. To achieve effective isolation and avoid etching process plasma charging effect, the isolation space 626z or boundary distance may be at least 0.5 μm or larger. Similarly, FIG. 21 illustrates the portion of the bottom metal mask layout 622 in relation to an overlay of a via mask portion 614 according to an embodiment of the present invention. This overlay is illustrated to depict the size of the via mask boundary 614x in relation to the boundary 625x of the bottom metal portion 625. Further illustrated is the size of a via to bottom boundary 625y between the via mask boundary 614x and the boundary 625x of the bottom metal plate portion 625. This via to bottom boundary 625y may be at least as large as 0.1 μm or larger. This via to bottom boundary may be sized in relation to the top metal process window consideration. This via to bottom boundary may also be sized in relation to an inter-metal dielectric boundary surrounding the via and a conductive via material, thereby providing isolation between a bottom metal layer and a top metal layer.

Figures 22, 23A, 24A:
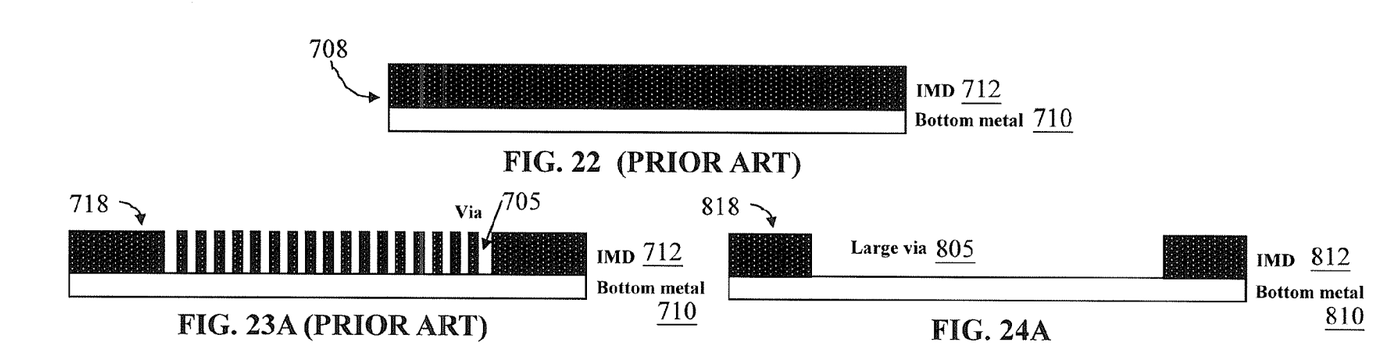

FIG. 22 illustrates a cross-sectional view of a portion of a semiconductor device 708 in preparation of forming a via.

The portion of the semiconductor device 708 includes a conductive bottom substrate layer 710, such as a bottom metal (e.g., Al and/or Cu), and an inter-metal dielectric layer 712 deposited on the conductive bottom substrate layer 710.

Figure 23B:
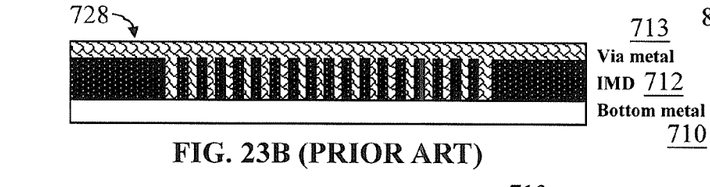
Figure 23C:
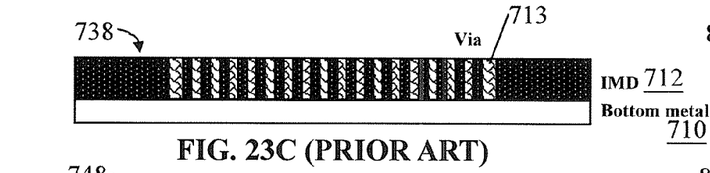

FIGS. 23A, 23B, 23C, and 23D are cross-sectional views of a conventional via fabrication process starting with the portion of the semiconductor device 708 of FIG. 22. FIG. 23A illustrates the resulting portion of semiconductor device 718 after via mask photo patterning, via etching, and photoresist and/or polymer (PR) removal, thereby forming a via defined by a plurality of equally spaced identically sized regions 705 of a matrix pattern. FIG. 23B illustrates the resulting portion of semiconductor device 728 after via metal deposition to fill in the plurality of equally spaced identically sized regions 705 of a matrix pattern with a conductive via material 713. FIG. 23C illustrates the resulting portion of semiconductor device 738 after chemical mechanical polishing/planarization (CMP) removal of conductive via material 713 remaining above the inter-metal dielectric layer 712. And FIG. 23D illustrates the resulting portion of semiconductor device 748 after deposition of a conductive top layer 714 disposed on the inter-metal dielectric layer 712 and the conductive via material 713. The resulting portion of semiconductor device 748 includes the conductive bottom substrate layer 710, the inter-metal dielectric layer 712, the via defined by the plurality of equally spaced identically sized regions 705 in which the conductive via material 713 has been deposited, and the conductive top layer 714.

Figure 24B:
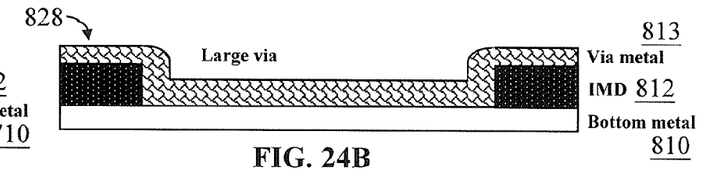
Figure 24C:
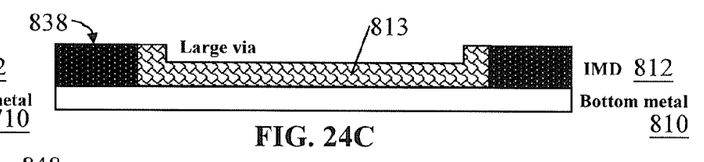
Figure 24D:
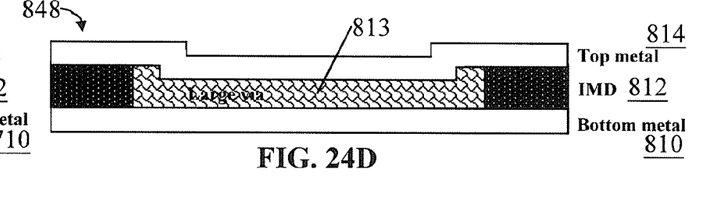

By comparison, FIGS. 24A, 24B, 24C, and 24D are cross-sectional views of a via fabrication process according to an embodiment of the present invention starting with the portion of the semiconductor device 708 of FIG. 22. FIG. 24A illustrates the resulting portion of semiconductor device 818 after via mask photo patterning, via etching, and photoresist and/or polymer residue (PR) removal, thereby forming a via defined by a single large area 805. FIG. 24B illustrates the resulting portion of semiconductor device 828 after via metal deposition to fill in the large via area 805 with a conductive via material 813, such as Tungsten (W). At least a portion of the conductive via material 813, such as towards and/or at the center of the large via area 805, may have a thickness and height less than the thickness and height of the surrounding inter-metal dielectric layer 812. The lower thickness of the conductive via material 813 may be a result of small via fill-in needing the via metal thickness to be thinner than the IMD layer. A lower conductive via metal thickness of a large via region may not result in a yield loss. Further, for added cost concern, the thickness of the conductive via material 813 may be lower than the IMD layer. The conductive via material 813 may span across the large via area 805 and over at least a portion of the inter-metal dielectric layer 812, and, thus, at the perimeter of the large via area 805, adjacent to the inter-metal dielectric layer 812, the conductive via material 813 may have a thickness and height at least equal to or higher than the thickness and height of the surrounding inter-metal dielectric layer 812. FIG. 24C illustrates the resulting portion of semiconductor device 838 after chemical mechanical polishing/planarization (CMP) removal of conductive via material 813 remaining above the inter-metal dielectric layer 812, such as conductive via material 813 spanning across at least a portion of the inter-metal dielectric layer 812 and any other conductive via material 813 having a thickness and height higher than the thickness and height of the surrounding inter-metal dielectric layer 812, such as at the perimeter of the large via area 805. And FIG. 24D illustrates the resulting portion of semiconductor device 848 after deposition of a conductive top layer 814, such as a top metal (e.g., Al and/or Cu), disposed on the inter-metal dielectric layer 812 and the conductive via material 813. The deposition of the conductive top layer 814 may be a slab deposition, followed by photo patterning and etching. The resulting portion of semiconductor device 848 includes the conductive bottom substrate layer 810, the inter-metal dielectric layer 812, the via defined by the large via area 805 in which the conductive via material 813 has been deposited, and the conductive top layer 814.

Another aspect of the present invention provides a method of fabricating or manufacturing semiconductor devices having large vias under metal pads and increasing via etching rates. Generally, methods of fabricating a semiconductor device, according to certain embodiments of the present invention, may include forming a large via, bounded by an inter-metal dielectric, on a conductive bottom substrate and covering the via and inter-metal dielectric with a conductive top layer.

Figure 25:
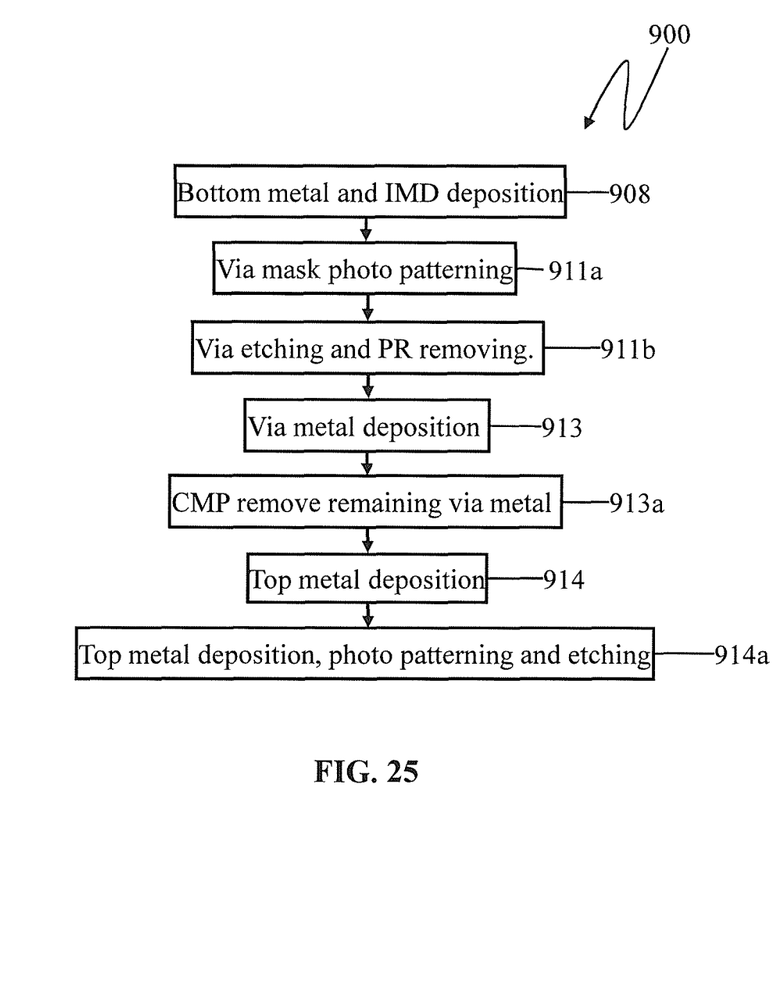
FIG. 25 is a process flow diagram showing various steps of fabricating a via of a semiconductor device according to an embodiment of the present invention.

Specifically, FIG. 25 is a process flow diagram showing various steps of a fabricating process 900 of a via of a semiconductor device according to certain embodiments of the present invention, such as the portion of semiconductor device 848 of FIG. 24D resulting from the illustrated precursor portions of semiconductor devices 818, 828, and 838 of FIGS. 24A, 24B, and 24C. At step 908 of process 900, a conductive bottom substrate layer, such as a bottom metal (e.g., Al and/or Cu), may be deposited as a slab, and an inter-metal dielectric layer may be deposited onto the conductive bottom substrate layer. Next, at step 911a, via mask photo patterning may be performed, following which via etching and photoresist and/or polymer residue (PR) removal may be performed, as indicated at step 911b, thereby forming a large via area. As indicated at step 913, conductive via material, such as a via metal, such as Tungsten (W), may be deposited to fill in the large via area with the conductive via material. As indicated at step 913a, Chemical mechanical polishing/planarization (CMP) may be performed to remove conductive via material 813 remaining above the inter-metal dielectric layer 812. And, as indicated at step 914, a deposition process may be performed to deposit a conductive top layer, such as a top metal (e.g., Al and/or Cu), on the inter-metal dielectric layer and the conductive via material. As necessary, as indicated at step 914a, additional top metal deposition, photo patterning, and etching may be performed.

Certain of the steps generally described above in the method may themselves comprise other sub-steps that have not necessarily been identified. Such additional steps are understood by a person of ordinary skill in the art having the benefit of this disclosure. Further, any manufacturing process known to those having ordinary skill in the art having the benefit of this disclosure may be used to manufacture the semiconductor devices in accordance with embodiments of the present invention.

As describe herein above, the design and structure of a large via according to the present invention provides a large open area and benefits from an increased photo patterning open ratio. This helps to increase etching rate and, thus, reducing the process time and power costs of the semiconductor device fabrication.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A semiconductor device comprising:
a conductive bottom substrate layer;
an inter-metal dielectric layer disposed on the conductive bottom substrate layer, wherein the inter-metal dielectric layer defines a via with the conductive bottom substrate layer and surrounded by the inter-metal dielectric layer, wherein the via comprises a conductive via material in contact with a portion of the conductive bottom substrate layer; and
a conductive top layer disposed on the inter-metal dielectric layer and the conductive via material,
wherein the portion of the conductive bottom substrate layer in contact with the conductive via material is isolated from adjacent portions of the conductive bottom substrate layer,
wherein the portion of the conductive bottom substrate layer in contact with the conductive via material is larger than the via, thereby providing an inter-metal dielectric boundary around the entire via above the portion of the conductive bottom substrate layer in contact with the conductive via material, and
wherein the via has a via area mask open ratio of at least 90% to a via mask to define the via.

2. The device of claim 1, wherein, when the conductive via has a size larger than 400 $\mu m^2$, the portion of the conductive bottom substrate layer in contact with the conductive via material is isolated from adjacent portions of the conductive bottom substrate layer by at least 0.5 $\mu m$.

3. The device of claim 1, wherein, when the conductive via has a size larger than 400 $\mu m^2$, the portion of the conductive bottom substrate layer in contact with the conductive via material is isolated from adjacent portions of the conductive bottom substrate layer by an isolation gap in the range of larger than 0.5 $\mu m$.

4. The device of claim 1, wherein, when the conductive via has a size larger than 400 $\mu m^2$, the inter-metal dielectric boundary around the entire via above the portion of the conductive bottom substrate layer in contact with the conductive via material is at least 0.1 $\mu m$ around the via.

5. The device of claim 1, wherein the inter-metal dielectric boundary around the entire via above the portion of the conductive bottom substrate layer in contact with the conductive via material is in the range of 0.1 $\mu m$ to 1.0 $\mu m$ around the via.

6. The device of claim 1, wherein the conductive bottom substrate layer comprises a metal, wherein the conductive via material comprises a metal, and wherein the conductive top layer comprises a metal.

7. The device of claim 1, wherein the via is between 10 $\mu m$ to 20 $\mu m$ in length.

8. The device of claim 7, wherein the via is between 10 $\mu m$ to 20 $\mu m$ in width.

9. The device of claim 1, wherein the via comprises a first open area of at least 10 $\mu m \times 10$ $\mu m$ and a second open area of less than 11 $\mu m \times 1$ $\mu m$.

* * * * *